US012757366B2

(12) United States Patent
Oyama

(10) Patent No.: US 12,757,366 B2
(45) Date of Patent: Oct. 6, 2026

(54) MOUNTING-RELATED SYSTEM

(71) Applicant: FUJI CORPORATION, Chiryu (JP)

(72) Inventor: Shigeto Oyama, Kariya (JP)

(73) Assignee: FUJI CORPORATION, Chiryu (JP)

( * ) Notice: Subject to any disclaimer, the term of this patent is extended or adjusted under 35 U.S.C. 154(b) by 684 days.

(21) Appl. No.: 18/251,323

(22) PCT Filed: Nov. 20, 2020

(86) PCT No.: PCT/JP2020/043318
§ 371 (c)(1),
(2) Date: May 1, 2023

(87) PCT Pub. No.: WO2022/107299
PCT Pub. Date: May 27, 2022

(65) Prior Publication Data

US 2024/0008235 A1 Jan. 4, 2024

(51) Int. Cl.
*H05K 13/02* (2006.01)

(52) U.S. Cl.
CPC .................................. *H05K 13/021* (2013.01)

(58) Field of Classification Search
CPC ........ H05K 13/021; G05B 2219/31003; G05B 19/41895; G05D 1/0225; G05D 1/0297; G06Q 10/08
See application file for complete search history.

(56) References Cited

U.S. PATENT DOCUMENTS 6,092,010 A * 7/2000 Alofs .................. G05D 1/0274 701/25
6,240,335 B1 * 5/2001 Wehrung ........... G05B 19/4189 198/577

(Continued)

FOREIGN PATENT DOCUMENTS

EP 3 567 997 A1 11/2019
JP 7-191723 A 7/1995

(Continued)

OTHER PUBLICATIONS

International Search Report issued Jan. 26, 2021 in PCT/JP2020/043318 filed on Nov. 20, 2020, 2 pages.

*Primary Examiner* — Thomas J Hong
*Assistant Examiner* — Jose K Abraham
(74) *Attorney, Agent, or Firm* — Oblon, McClelland, Maier & Neustadt, L.L.P.

(57) ABSTRACT

A mounting-related system which includes a mounting-related facility for performing a mounting process and in which a member used in the mounting process is automatically conveyed to the mounting-related facility by an automatic conveyance vehicle, including a storage section configured to store instruction content for travel of the automatic conveyance vehicle, a display section configured to display instruction blocks of multiple types of the automatic conveyance vehicle on the screen to be selectable by an operator, a setting section configured to set a travel instruction flow of the automatic conveyance vehicle that performs the automatic conveyance in the mounting-related system, based on the instruction block selected by the operator from among the instruction blocks displayed on the screen, and a control section configured to perform a travel control of the automatic conveyance vehicle based on the set travel instruction flow.

4 Claims, 9 Drawing Sheets

(56) References Cited

U.S. PATENT DOCUMENTS

| | | | | |
|---|---|---|---|---|
| 7,991,521 | B2 * | 8/2011 | Stewart | G05D 1/0265 180/170 |
| 9,801,317 | B2 * | 10/2017 | Kurashina | H05K 13/085 |
| 2003/0233177 | A1 | 12/2003 | Johnson et al. | |
| 2015/0206086 | A1 * | 7/2015 | Kitayama | G06Q 10/0631 705/7.26 |
| 2018/0242485 | A1 * | 8/2018 | Kondo | H05K 13/0473 |
| 2019/0313554 | A1 * | 10/2019 | Ao | H05K 13/021 |
| 2021/0015012 | A1 * | 1/2021 | Kondo | H05K 13/021 |

FOREIGN PATENT DOCUMENTS

| | | | |
|---|---|---|---|
| JP | 9-138789 | A | 5/1997 |
| JP | 2019-91770 | A | 6/2019 |

* cited by examiner

Fig. 6

44a

| MANUFACTURER | INSTRUCTION BLOCK |
|---|---|
| AGV FOR COMPANY A | DESIGNATED GOAL GUIDELESS TRAVEL |
| | GUIDE TAPE TRAVEL |
| | BUZZER NOTIFICATION |
| | VOICE ANNOUNCEMENT |
| AGV FOR COMPANY B | DESIGNATED GOAL GUIDELESS TRAVEL |
| AGV FOR COMPANY C | GUIDE TAPE TRAVEL |
| AGV FOR COMPANY D | DESIGNATED GOAL GUIDELESS TRAVEL |
| | DESIGNATED DISTANCE ADVANCE |
| AGV FOR COMPANY E | TRAVEL TO INTERMEDIATE POINT |
| | TRAVEL TO PRE-EXCHANGE POSITION N |
| | GUIDE TAPE TRAVEL TO EXCHANGE POSITION N |
| | DESIGNATED DISTANCE RETREAT |
| | TRAVEL TO OVERLAPPING AREA |

MOUNTING-RELATED SYSTEM

TECHNICAL FIELD

The present specification discloses a mounting-related system.

BACKGROUND ART

Conventionally, there has been known a mounting-related system which includes a mounting-related facility such as a mounter that performs a mounting process for mounting a component on a board and in which a member or the like for supplying components is automatically conveyed to the mounting-related facility by an automatic conveyance vehicle (automatic conveyance apparatus) (see, for example, Patent Literature 1). Further, a simulator which selects and takes in control data of automatic conveyance vehicles of multiple manufacturers and performs evaluation on the same route is known as a simulator for evaluating performance of the automatic conveyance vehicle (see, for example, Patent Literature 2).

PATENT LITERATURE

Patent Literature 1: JP-A-2019-091770
Patent Literature 2: JP-A-H9-138789

BRIEF SUMMARY

Technical Problem

It is considered to introduce an automatic conveyance vehicle with a high evaluation in a simulator execution result of Patent Literature 2 into a mounting-related system described in Patent Literature 1. However, in Patent Literature 2, control data of an automatic conveyance vehicle of multiple manufacturers is selected when a simulation is operated, and it is not considered to select data related to a travel instruction (travel control) in the mounting-related system. Accordingly, in order to perform the travel instruction according to the type of automatic conveyance vehicle such as a manufacturer of the automatic conveyance vehicle to be introduced into the mounting-related system, a user needs to perform various types of setting, which increases burden of the user.

A main object of the present disclosure is to easily perform a travel instruction according to a type of an automatic conveyance vehicle for performing automatic conveyance in a mounting-related system.

Solution to Problem

The present disclosure employs the following means in order to achieve the above-described main object.

A mounting-related system of the present disclosure is a mounting-related system which includes a mounting-related facility for performing a mounting process and in which a member used in the mounting process is automatically conveyed to the mounting-related facility by an automatic conveyance vehicle, and includes a storage section configured to store instruction content for performing an instruction for travel of the automatic conveyance vehicle, for each of multiple types of the automatic conveyance vehicle as an instruction block capable of being block-displayed on a screen, a display section configured to display the instruction blocks of the multiple types of the automatic conveyance vehicle on the screen to be selectable by an operator, a setting section configured to set a travel instruction flow of the automatic conveyance vehicle that performs the automatic conveyance in the mounting-related system, based on the instruction block selected by the operator from among the instruction blocks displayed on the screen, and a control section configured to perform a travel control of the automatic conveyance vehicle based on the set travel instruction flow.

In the mounting-related system of the present disclosure, instruction blocks of multiple types of an automatic conveyance vehicle are displayed on a screen so as to be selectable by an operator, a travel instruction flow of the automatic conveyance vehicle is set based on the instruction block selected by the operator, and a travel control of the automatic conveyance vehicle is performed based on the travel instruction flow. Accordingly, by selecting an instruction block according to the type of an automatic conveyance vehicle that performs an automatic conveyance in a mounting-related system, an operator can easily set a travel instruction flow according to the type of the automatic conveyance vehicle. Further, a travel instruction flow need not be constructed every time a travel control is performed, and thus, a travel control of an automatic conveyance vehicle can be easily made. Therefore, it is possible to easily perform a travel instruction according to the type of an automatic conveyance vehicle that performs an automatic conveyance in a mounting-related system.

BRIEF DESCRIPTION OF DRAWINGS

FIG. 6 is an explanatory diagram illustrating an example of instruction block 44*a*.

DESCRIPTION OF EMBODIMENTS

Figure 1:
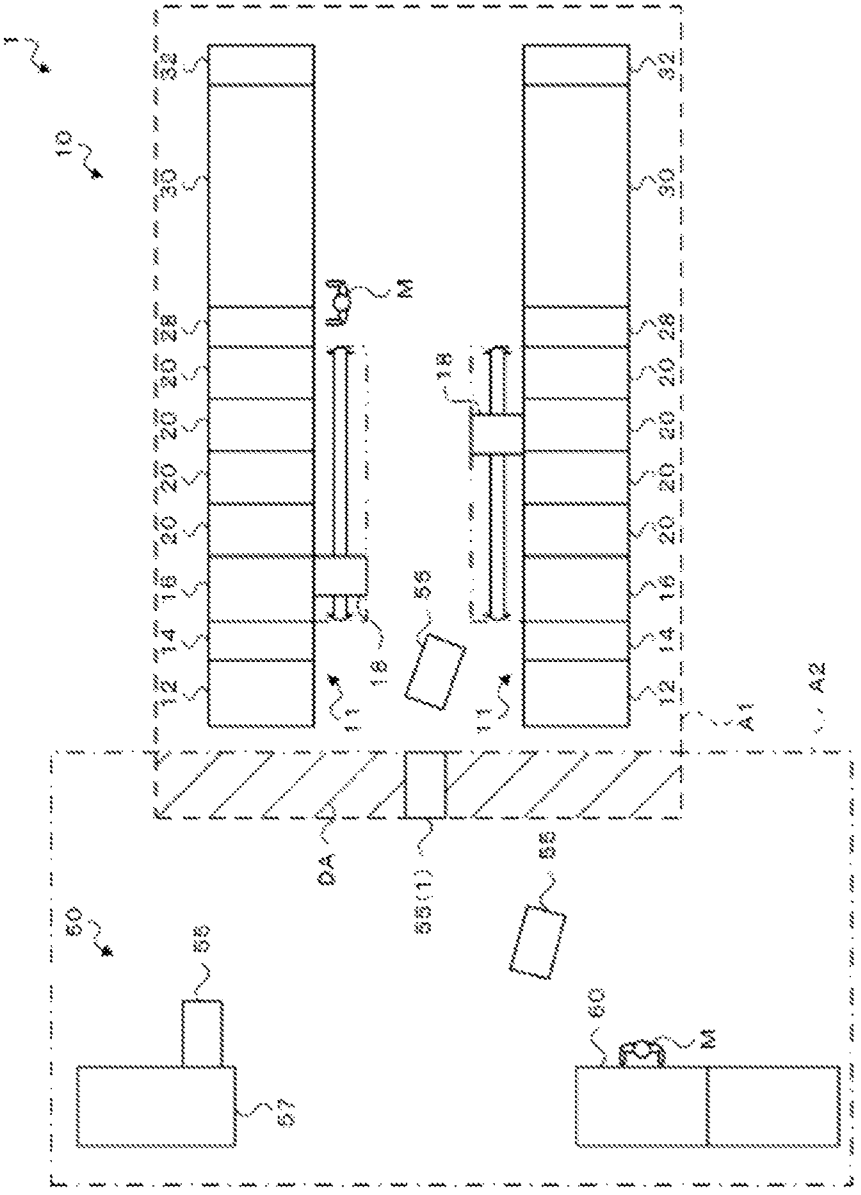
FIG. 1 is an explanatory view illustrating an example of work system 1.
Figure 2:
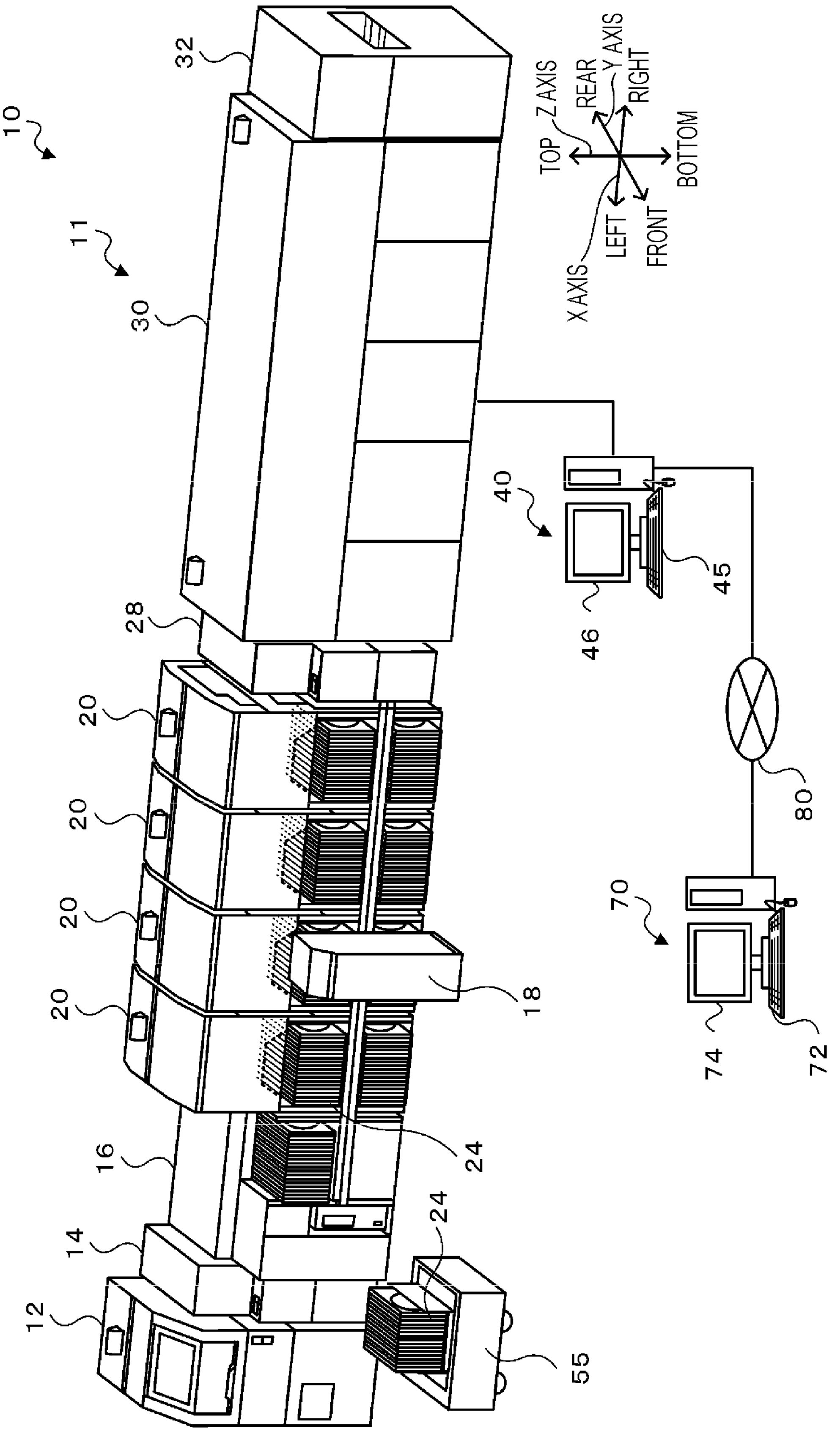
FIG. 2 is an explanatory view schematically illustrating a configuration of mounting line 11.
Figure 3:
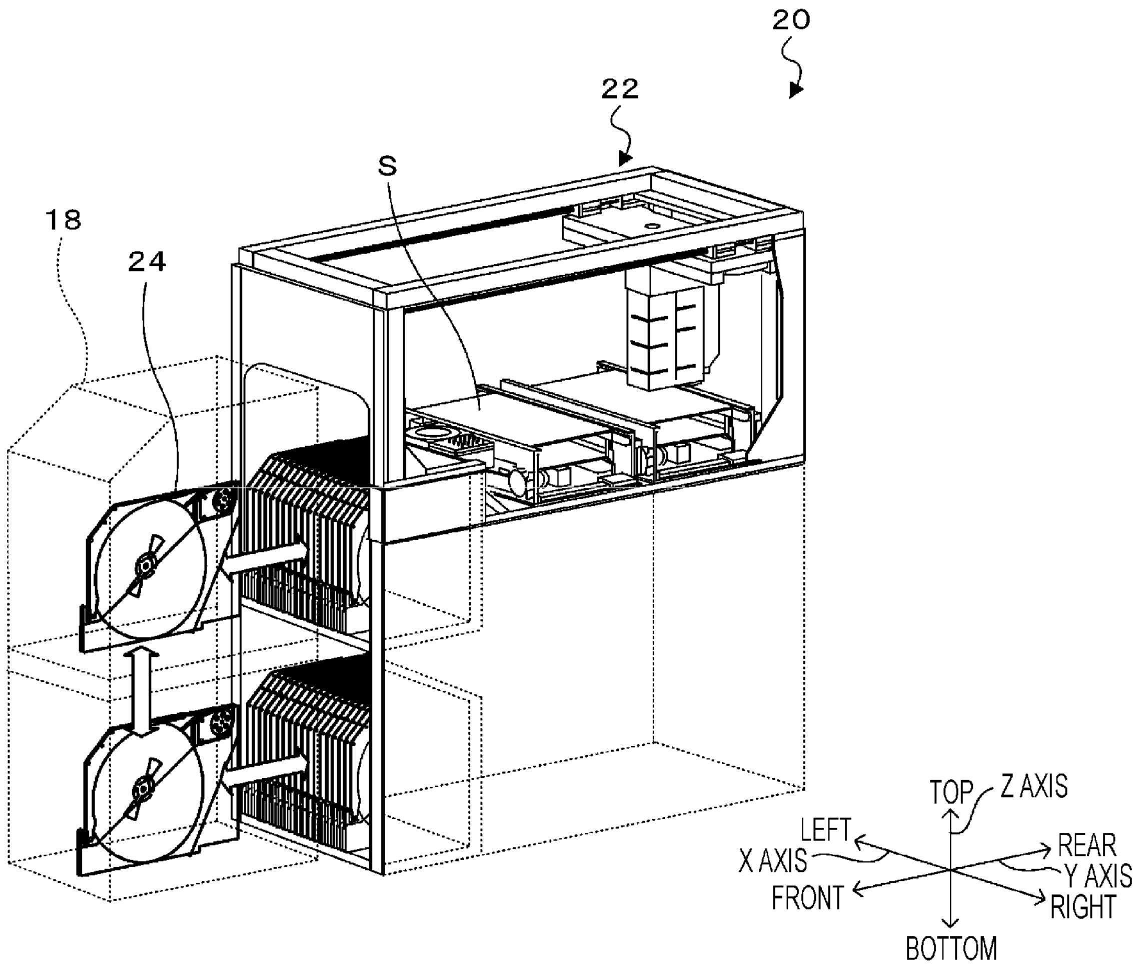
FIG. 3 is an explanatory view schematically illustrating a configuration of mounter 20.
Figure 4:
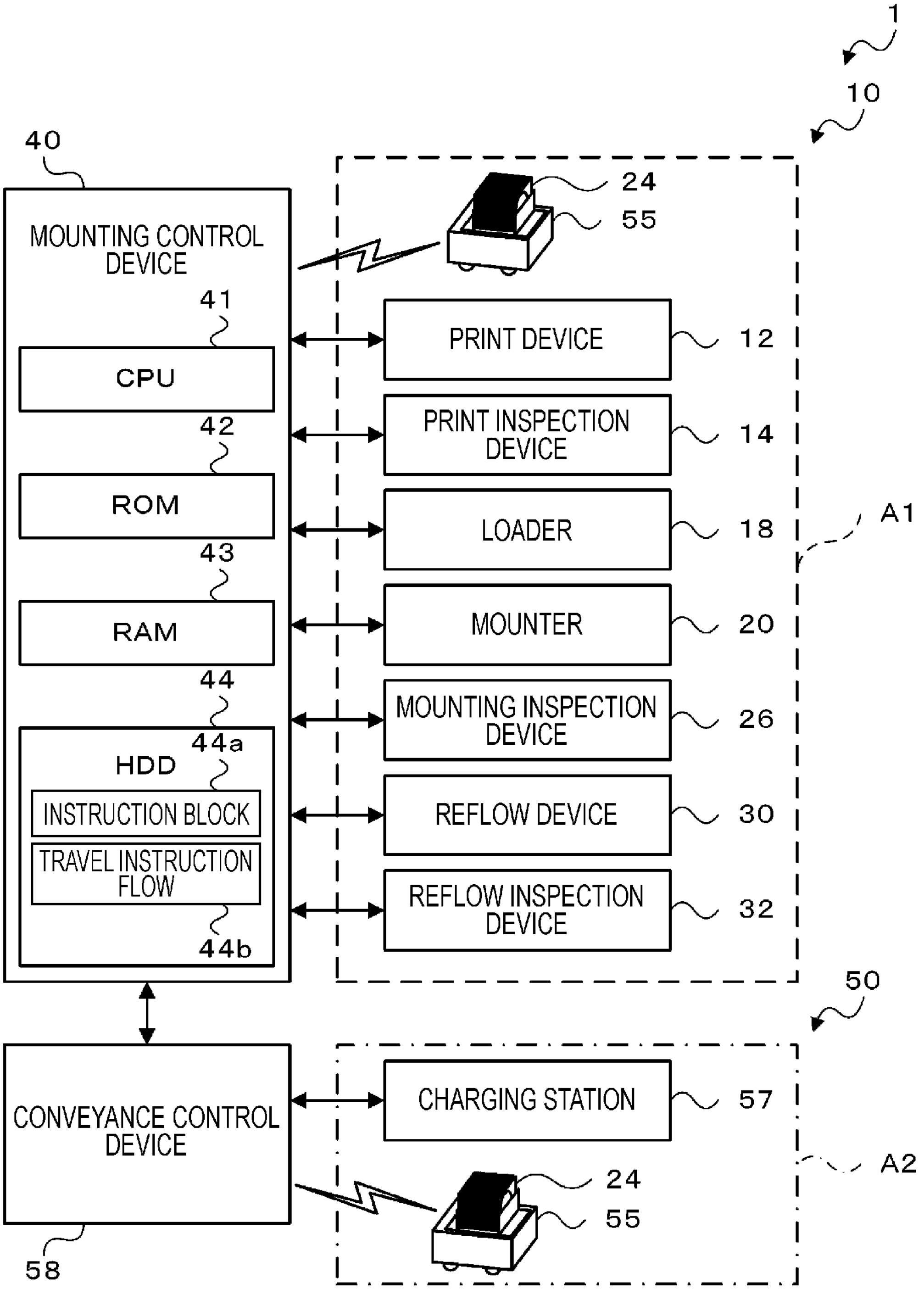
FIG. 4 is a block diagram illustrating a configuration related to control of work system 1.

Next, embodiments of the invention will be described with reference to accompanying drawings. FIG. 1 is an explanatory view illustrating an example of work system 1. FIG. 2 is an explanatory view schematically illustrating a configuration of mounting line 11. FIG. 3 is an explanatory view schematically illustrating a configuration of mounter 20. FIG. 4 is a block diagram illustrating a configuration related to control of work system 1. In the present embodiment, a left-right direction (an X axis), a front-rear direction (a Y axis), and an up-down direction (a Z axis) are as illustrated in FIGS. 2 and 3.

Work system 1 includes mounting-related system 10 for performing a mounting process (a mounting work) of components on board S, and conveyance system 50 for performing conveyance (a conveyance work) of various members used in the mounting process. Mounting-related system 10 includes two mounting lines 11 and mounting control device 40. Further, conveyance system 50 includes multiple automatic conveyance vehicles 55 (hereinafter, referred to as AGVs 55), charging station 57, and conveyance control device 58.

Multiple mounting-related facilities related to a mounting process are disposed in each mounting line 11. The mounting-related facility includes, for example, one or more of print device 12, print inspection device 14, storage chamber 16, mounter 20, mounting inspection device 28, reflow device 30, reflow inspection device 32, and the like. These are disposed side by side in a conveyance direction of board S (an X-axis direction). Further, the mounting-related facility of the present embodiment includes loader 18. Respective mounting lines 11 may have the same configuration as or different configurations from each other. In the present embodiment, as described below, in an area on a side of the mounting-related system 10 that is an area around mounting line 11, a travel control of AGV 55 is performed on the side of mounting-related system 10. This area is referred to as mounting-side control area A1 (a predetermined area) (see a dashed line in FIG. 1). Further, in an area (a non-mounting-side control area and a setup area) on a side of conveyance system 50 other than mounting-side control area A1, the travel control of AGV 55 is performed on the side of conveyance system 50. This area is referred to as conveyance-side control area A2 (see an alternate long and short dashed line in FIG. 1).

Print device 12 performs printing on board S (see FIG. 3) by pushing solder into pattern holes formed in a screen mask. Print inspection device 14 inspects a state of the solder printed by print device 12. Mounting inspection device 28 inspects a mounting state of a component mounted on board S by mounter 20. Reflow device 30 melts the solder by heating board S on which the component is disposed on the solder and then cools the solder, and thereby, the component is electrically connected to board S to be fixed to board S. Reflow inspection device 32 inspects a state of the component on board S after reflow.

Multiple mounters 20 are disposed in a conveyance direction of board S and mount components on board S. As illustrated in FIG. 3, mounter 20 includes mounting unit 22 and feeder 24. Mounting unit 22 is a unit for collecting components and mounting the components on board S by using a mounting head on which a collection member such as a nozzle is mounted. Feeder 24 is configured as a tape feeder to which a reel on which a tape holding a component at a predetermined pitch is wound is detachably attached and which feeds the tape to supply the component by rotating the reel.

Loader 18 is configured to be movable in a movement area in the conveyance direction of board S on a front surface side of multiple mounters 20 and storage chamber 16. Loader 18 moves in the movement area to automatically exchange (retrieve or replenish) a member used for a mounting process. For example, loader 18 automatically exchanges feeder 24 which is a work unit that can be exchanged for mounter 20, but may automatically exchange members used for a mounting process, such as a head, a collection member such as a nozzle, an accommodation member of solder, and a screen mask, which are provided in mounting unit 22.

Storage chamber 16 is an in-line storage for storing various members used in the mounting process in each mounting line 11, and stores, for example, feeder 24. Worker M replenishes or retrieves feeder 24 in storage chamber 16. Further, loader 18 is capable of automatically exchanging feeder 24 for storage chamber 16, taking out necessary feeder 24 from storage chamber 16 to replenish feeder 24 to mounter 20, or taking out used feeder 24 from mounter 20 to retrieve in storage chamber 16. Further, in storage chamber 16, AGV 55 can also replenish or retrieve feeder 24. That is, storage chamber 16 is used commonly by worker M, loader 18, and AGV 55, and moving-in and moving-out operations of feeder 24 are performed.

Mounting control device 40 is a general-purpose computer including CPU 41, ROM 42, RAM 43, HDD 44, and the like and is connected to input device 45 such as a keyboard or a mouse, and an output device 46 such as a display. A storage device such as HDD 44 stores a production program of board S, production information related to the production of board S, multiple types of instruction blocks **44*a*, travel instruction flow 44*b*, a mounting-related facility control flow, and the like. The production program defines a mounting sequence of components on board S, the number of produced boards S, and the like. Further, the production information includes information indicating a print position of solder on board S, information of a component to be mounted on board S, a mounting position of each component, and the like. The information of a component indicates not only the type of component to be mounted on each mounter 20, but also a disposition state of feeder 24 in each mounter 20 and storage chamber 16 as an inventory status of components. Instruction block 44*a* is configured to store instruction content for giving an instruction related to travel of AGV 55 to be block-displayed on a screen of a display. Travel instruction flow 44*b* is set by using instruction block 44*a* displayed on the screen. Details of instruction block 44*a*, travel instruction flow 44*b***, and the mounting-related facility control flow are described below.

When producing board S, mounting control device 40 applies various command signals to print device 12, print inspection device 14, loader 18, mounter 20, mounting inspection device 28, reflow device 30, reflow inspection device 32, and the like based on the production program and the production information. Further, mounting control device 40 is configured to be communicably connected to AGV 55, for example, by wireless, and travel control of AGV 55 can be made. Further, mounting control device 40 is communicably connected to conveyance control device 58 and exchanges information on a production state of board S and on feeder 24 necessary for production, information on control of AGV 55, and the like. Mounting control device 40 is connected to manufacturer terminal 70 of one or more manufacturers of AGV via network 80. Manufacturer terminal 70 is a general-purpose computer including CPU, ROM, RAM, HDD, and the like and is connected to input device 72, such as a keyboard or a mouse, and output device 74 such as a display.

Although not illustrated, AGV 55 includes a motor for rotationally driving wheels, a battery for supplying electric power, a speaker for outputting sound, and the like, and automatically conveys members such as feeder 24 used in a mounting process between warehouse and storage chamber 16. For example, AGV 55 takes out used feeder 24 from storage chamber 16, automatically conveys feeder 24 to warehouse 60 to be accommodated therein, or takes out necessary feeder 24 from warehouse 60 to automatically convey feeder 24 to storage chamber 16 to be accommodated therein. Although AGV 55 automatically conveys feeder 24, AGV 55 may automatically convey members used in a mounting process, such as a head, a collection member such as a nozzle, an accommodation member of solder, and a screen mask, which are provided in mounting unit 22. Warehouse 60 stores various members such as feeder 24 accommodated by worker M. Charging station 57 is a facility for charging a battery of one or more AGVs 55 parked in a predetermined charging position. When AGV 55 is parked in a predetermined charging position, charging station 57 may have a configuration in which a connector is connected to enable power supply or may have a configuration in which power supply is enabled without contact.

Conveyance control device 58 is a general-purpose computer including CPU, ROM, RAM, HDD, and the like, and is connected to an input device such as a keyboard or a mouse and an output device such as a display. Conveyance control device 58 is configured to be communicably connected to AGV 55 by wireless, performs a travel control of AGV 55, acquires a state such as a remaining amount of battery of AGV 55, and the like. Further, conveyance control device 58 also performs a charging control or the like of AGV 55 in charging station 57. Further, conveyance control device 58 creates a travel plan of AGV 55 including a conveyance schedule, a charging schedule, a dispatch schedule, and the like of each AGV 55 based on a production state of board S transmitted from mounting control device 40, information related to the feeder 24 necessary for production, a remaining amount of a battery of AGV 55, and the like.

In the work system 1 configured in this manner, as described above, mounting control device 40 performs a travel control of AGV 55 in mounting-side control area A1, and conveyance control device 58 performs a travel control of AGV 55 in conveyance-side control area A2. As illustrated in FIG. 1, mounting-side control area A1 and conveyance-side control area A2 have overlapping area DA that overlaps each other (a hatched portion in FIG. 1). In overlapping area DA, both mounting control device 40 and conveyance control device 58 can control travel of AGV 55, and a control subject of AGV 55 can be switched between the two control devices. When AGV 55 is caused to move back and forth between mounting-side control area A1 and conveyance-side control area A2, AGV 55 is moved to a predetermined switching position determined in overlapping area DA to switch the control subject. Accordingly, a travel control is made by setting a destination of AGV 55 as a switching position in overlapping area DA. A predetermined switching position is, for example, a position of AGV 55(1) in FIG. 1, and multiple other positions may be determined.

Figure 5:
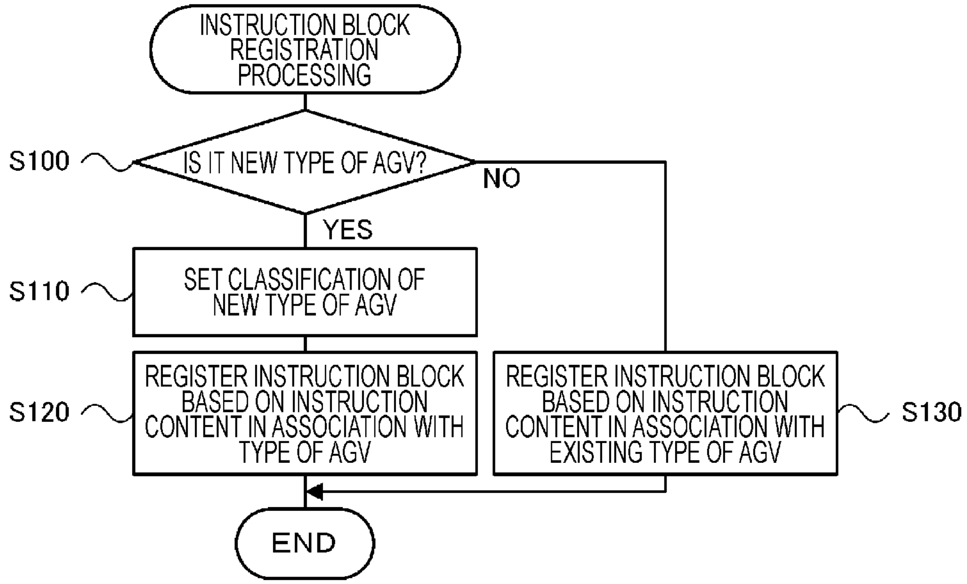
FIG. 5 is a flowchart illustrating an example of instruction block registration processing.

In this way, in the present embodiment, mounting-related system 10 (mounting control device 40) may perform a travel control of AGV 55. Here, since conveyance control device 58 of conveyance system 50 is usually introduced by a manufacturer of AGV 55 or the like according to the type of AGV 55, a travel instruction of AGV 55 can be appropriately output according to a communication method of AGV 55. Meanwhile, mounting-related system needs to output a travel instruction according to the introduced type of AGV 55 among multiple types of AGVs 55. Accordingly, when work system 1 is constructed or when new AGV 55 is introduced, it is necessary to perform setting for mounting control device 40 to issue a travel instruction to AGV 55. HDD 44 of mounting control device 40 stores instruction block 44*a* for performing the setting. Details of instruction block 44*a* are described below. FIG. 5 is a flowchart illustrating an example of instruction block registration processing.

The instruction block registration processing of FIG. 5 is performed when CPU 41 of mounting control device 40 receives, via network 80, instruction content related to a travel instruction registered on a registration screen (not illustrated) displayed on a display or the like of manufacturer terminal 70. First, CPU 41 determines whether the instruction content is an instruction for a new type of AGV 55 (S100). When determining that the instruction content is an instruction for a new type of AGV 55, CPU 41 sets a classification of the new type of AGV 55 (S110), and registers, in the HDD 44, instruction block 44*a* based on the instruction content in association with the type of AGV 55 (S120), and ends the registration processing. Meanwhile, when determining that the instruction content is not a new type in S100 but an additional instruction content for a previously registered type of AGV 55, CPU 41 registers, in HDD 44, instruction block 44*a* based on the instruction content in association with the existing type of AGV (S130), and ends the registration processing.

FIG. 6 is an explanatory diagram illustrating an example of instruction block 44*a*. Instruction block 44*a* is classified and registered for each type of AGV 55 by the instruction block registration processing described above. In the present embodiment, for example, the type of AGV 55 is classified for each manufacturer, but AGVs 55 of the same manufacturer may be classified for each type. In instruction block 44*a* illustrated in FIG. 6, "guideless travel to designated goal", "guide tape travel", "buzzer notification", and "voice announcement" are stored for AGV 55 of company A. The "guideless travel to designated goal" is stored for AGV 55 of company B. The "guide tape travel" and the "buzzer notification" are stored for AGV 55 of company C. The "guideless travel to designated goal" and "designated distance advance" are stored for AGV 55 of company D. "Travel to intermediate point", "travel to pre-exchange position N", "guide tape travel to exchange position N", "designated distance retreat", and "travel to overlapping area" are stored for AGV 55 of company E.

The "guide tape travel", the "guideless travel to designated goal", the "designated distance advance", the "travel to intermediate point", the "travel to pre-exchange position N", the "guide tape travel to exchange position N", the "designated distance retreat", and the "travel to overlapping area" are instruction contents related to travel. The "guide tape travel" and the "guide tape travel to exchange position N" are methods of travel along a guide tape such as a magnetic tape or an optical tape provided on a travel path of a floor surface of each area. N of exchange position N represents the number of multiple exchange positions and can be designated in the order of an exchange position 1, an exchange position 2, . . . . Likewise, pre-exchange position N represents a number of a position determined to correspond to each exchange position N as a front position of exchange position N, and can be designated in the order of a pre-exchange position 1, a pre-exchange position 2, . . . . The "guideless travel to designated goal" is a method in which a target position of a goal is designated and AGV 55 automatically measures a current position, a travel distance, and the like and performs travel while adjusting a travel direction. Further, the "designated distance advance" and the "designated distance retreat" are methods of moving straight forward or obliquely forward from a certain position by a designated distance, or moving straight rearward or obliquely rearward from a certain position by a designated distance. an oblique angle (direction) during moving obliquely forward or obliquely reward may be randomly designated. Further, the intermediate point in the "travel to intermediate point" is a place previously determined in mounting-side control area A1 so as not to interfere with movement of loader 18. In the "travel to overlapping area", the predetermined switching position described above is defined as a target position. The "travel to intermediate point" or the "travel to overlapping area" are methods in which AGV 55 automatically measures a current position, a travel distance, and the like and travels to a target position while adjusting a travel direction.

The "buzzer notification" and the "voice announcement" are instruction contents accompanying a travel other than the travel method, and both notify worker M that AGV 55 is travel. In the "buzzer notification", a buzzer sound indicating that AGV 55 is travel is output from a speaker of AGV 55. Further, in the "voice announcement", a voice indicating that AGV 55 is travel is output from the speaker of AGV 55. The "buzzer notification" and the "voice announcement" are capable of being randomly selected by worker M (operator) as to whether to be included in a travel instruction flow. For communication with AGV 55, various methods may be adopted depending on types of AGV 55, such as a telnet connection or via a programmable logic controller (PLC). In the present embodiment, as instruction block 44*a* is classified for each type of AGV 55, a method according to the type of AGV 55 is also defined as a communication method. Accordingly, by setting a travel instruction flow by using instruction block 44*a* according to the type of AGV 55 as described below, the communication method according to the type of AGV 55 can also be set, and a travel instruction can be output.

Figure 7:
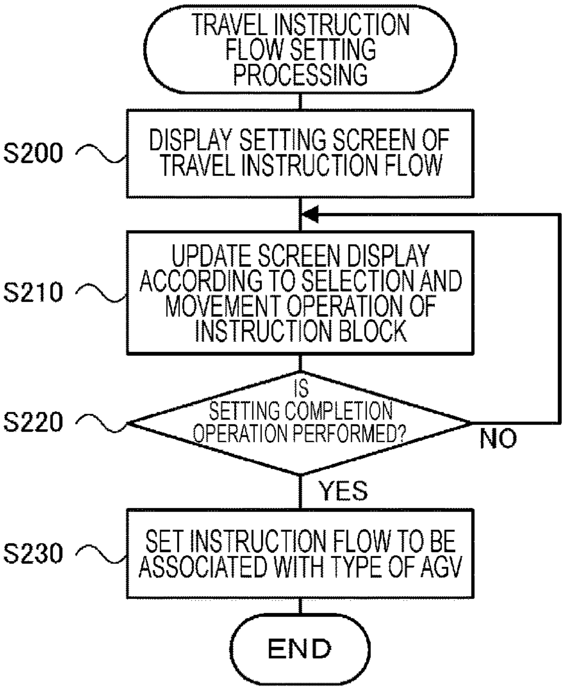
FIG. 7 is a flowchart illustrating an example of travel instruction flow setting processing.

In this way, multiple instruction blocks 44*a* are registered in HDD 44 by being classified for each type of AGV 55. Then, mounting control device 40 performs a travel control of AGV 55 based on travel instruction flow 44*b* set by combining instruction blocks 44*a* according to the type of AGV 55 introduced into work system 1 (mounting-related system 10), that is, the type of AGV 55 of a control target. Hereinafter, the setting of travel instruction flow 44*b* will be described. FIG. 7 is a flowchart illustrating an example of travel instruction flow setting processing.

Figure 8:
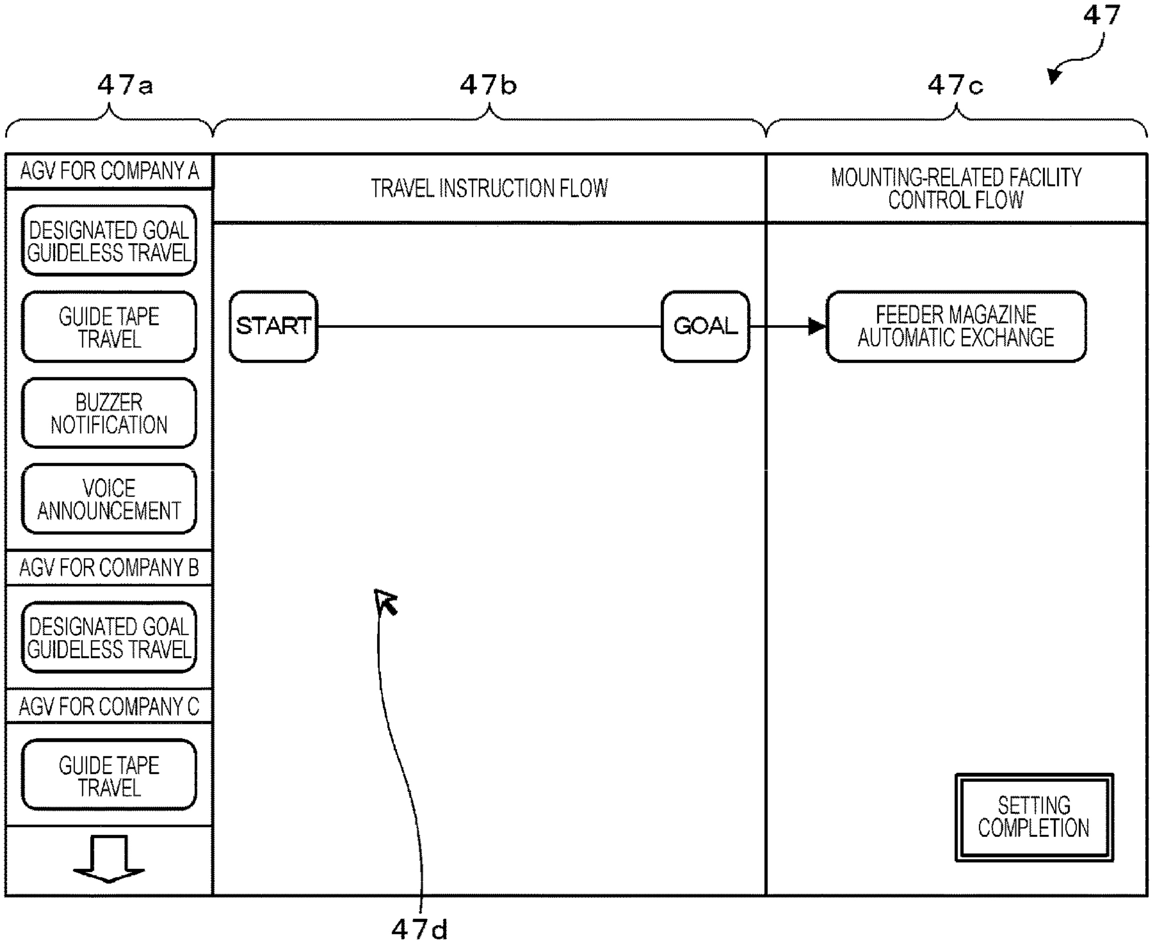
FIG. 8 is an explanatory diagram illustrating an example of flow setting screen 47.
Figure 9:
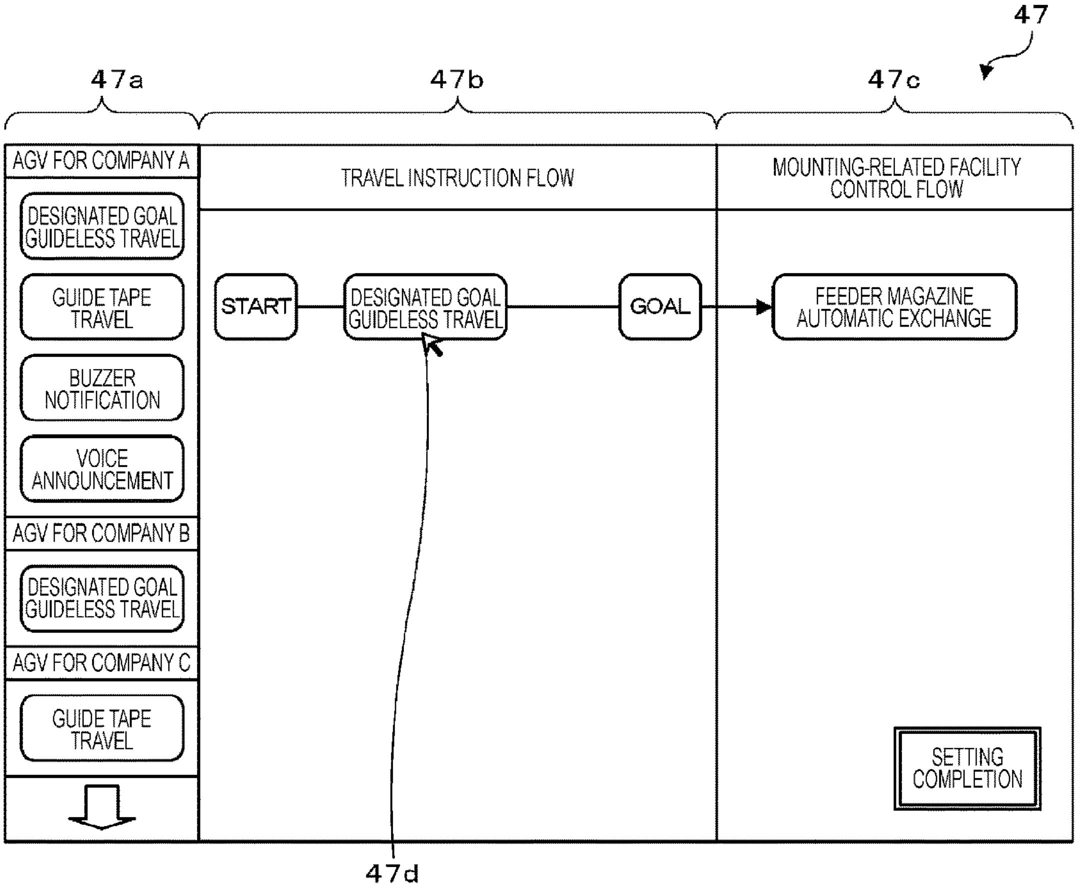
FIG. 9 is an explanatory diagram illustrating an example of flow setting screen 47.

In the travel instruction flow setting processing illustrated in FIG. 7, first CPU 41 of mounting control device 40 displays setting screen 47 for setting a travel instruction flow according to the type of AGV 55 on output device 46 such as a display (S200). FIGS. 8 and 9 are explanatory diagrams illustrating examples of flow setting screen 47. In setting screen 47, block display field 47*a* for displaying instruction block 44*a* for each type of AGV 55 is provided on a left side of the screen, travel instruction flow display field 47*b* for displaying a travel instruction flow is provided in the center of the screen, and mounting-related facility control flow display field 47*c* for displaying a mounting-related facility control flow is provided on a right side of the screen. In block display field 47*a*, by scrolling downward, an instruction block (for example, automatic exchange of feeder 24) in the mounting-related facility control flow can be displayed in addition to other instruction blocks 44*a* for, for example, company D, company E, and the like. All instruction blocks 44*a* may be displayed without scrolling. Further, in setting screen 47, instruction pointer 47*d* operated by input device 45 such as a mouse is also displayed, and accordingly, a selection operation and a movement operation of instruction block 44*a*, a click operation of a setting completion button indicating completion of setting of travel instruction flow display field 47*b* and mounting-related facility control flow display field 47*c*, and the like can be performed by using instruction pointer 47*d.*

When setting screen 47 is displayed, CPU 41 updates a screen display according to the selection operation or the movement operation of instruction block 44*a* by using instruction pointer 47*d* (S210), and determines whether a setting completion operation is performed by the click operation of the setting completion button by using instruction pointer 47*d* (S220). In setting screen 47, as illustrated in FIG. 9, a travel instruction flow can be set by moving instruction block 44*a* selected by instruction pointer 47*d* and disposing instruction block 44*a* on a line from block START to block GOAL. That is, by performing drag-and-drop operation of the instruction block 44*a* by using instruction pointer 47*d* on setting screen 47, worker M can easily set (create) the travel instruction flow by arranging instruction block 44*a* moved from block display field 47*a* to travel instruction flow display field 47*b*. Without being limited to extending in a straight line in a horizontal direction from block START to block GOAL, instruction block 44*a* may be extended in a straight line in a vertical direction, or may be extended so as to be folded back at one position or at multiple positions such that more instruction blocks 44*a* can be arranged (see FIG. 13). Further, worker M can set the mounting-related facility control flow by dragging and dropping an instruction block in mounting-related facility control flow display field 47*c*. The instruction block of mounting-related facility control flow display field 47*c* can include automatic exchange of feeder 24 (a feeder magazine), retreat of loader 18, and return of loader 18.

Figure 10:
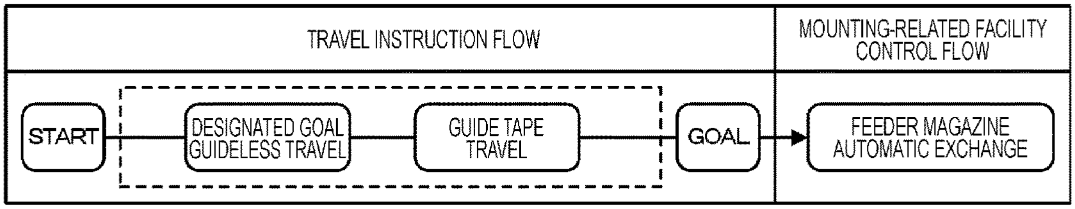
FIG. 10 is an explanatory diagram illustrating an example of flow setting content.
Figure 11:
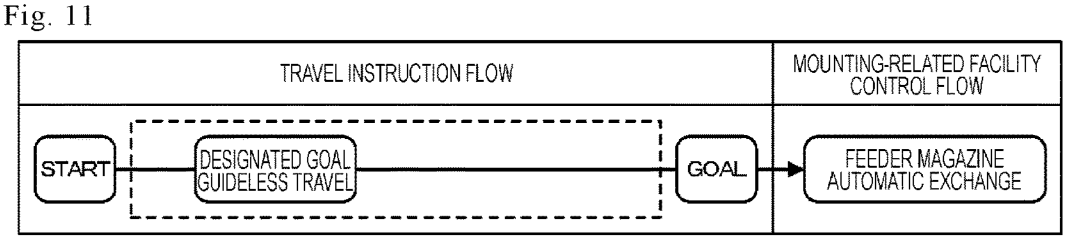
FIG. 11 is an explanatory diagram illustrating an example of the flow setting content.

When it is determined that the setting completion operation is performed in step S220, CPU 41 stores travel instruction flow 44*b* in which setting content is associated with the type of AGV 55 in HDD 44 or the like (step S230), and ends the travel instruction flow setting processing. FIGS. 10 and 11 are explanatory diagrams illustrating examples of flow setting content, wherein a portion surrounded by a dashed line is a portion set according to the type of AGV 55. FIG. 10 illustrates an example of setting content of AGV 55 of company A, and FIG. 11 illustrates an example of setting content of AGV 55 of company B. As illustrated in FIG. 10, for AGV 55 of company A, a travel instruction flow is set to move to a goal by performing the "guide tape travel" after the "guideless travel to designated goal", and a control flow is set to perform the "automatic exchange" of feeder 24 when reaching the goal. Meanwhile, for AGV 55 of company B, the travel instruction flow is set to move to a goal by performing the "guideless travel to designated goal", and the control flow is set to perform the "automatic exchange" of feeder 24 when reaching the goal.

When performing a travel control of AGV 55, CPU 41 can perform the travel control by reading travel instruction flow 44*b* from HDD 44, adding necessary information such as position coordinates of the goal, and transmitting a travel instruction to AGV 55. For example, when the goal is storage chamber 16, CPU 41 needs to initiate the travel control of AGV 55 after loader 18 retreats from the front of storage chamber 16. Further, when AGV 55 reaches storage chamber 16 that is the goal, CPU 41 reads the mounting-related facility control flow and transmits a work instruction to AGV 55, thereby causing an automatic exchange work such as replenishment and retrieval of feeder 24 to be performed. This process will be described with reference to FIG. 13.

Figure 12:
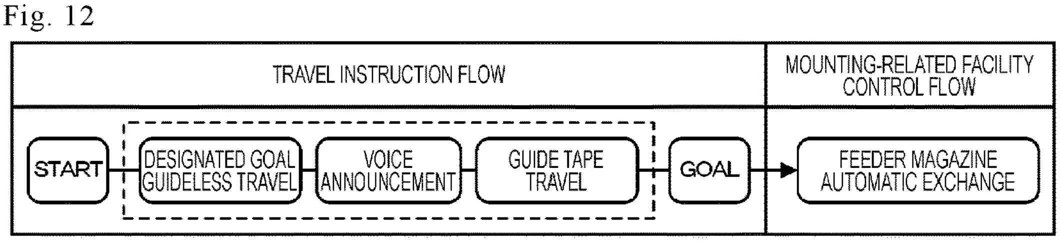
FIG. 12 is an explanatory diagram illustrating an example of the flow setting content.

FIG. 12 illustrates another example of a setting content of AGV 55 of company A as the flow setting content. In this travel instruction flow, unlike FIG. 10, the "voice announcement" is set before the "guide tape travel". Accordingly, AGV 55 travels on a guide tape while outputting the voice announcement. In this way, a travel instruction flow obtained by combining different instruction blocks 44*a* can be set for AGV 55 of the same type (the same company A). That is, worker M can easily set the travel instruction flow as needed in consideration of a situation and the like around AGV 55 travel in mounting-related system 10 and can perform the travel control of AGV 55. Even when the travel instruction flow is set once, worker M can easily perform a setting change such as changing, for example, the "voice announcement" to the "buzzer notification" or removing the "voice announcement" by performing the travel instruction flow setting processing again.

Figure 13:
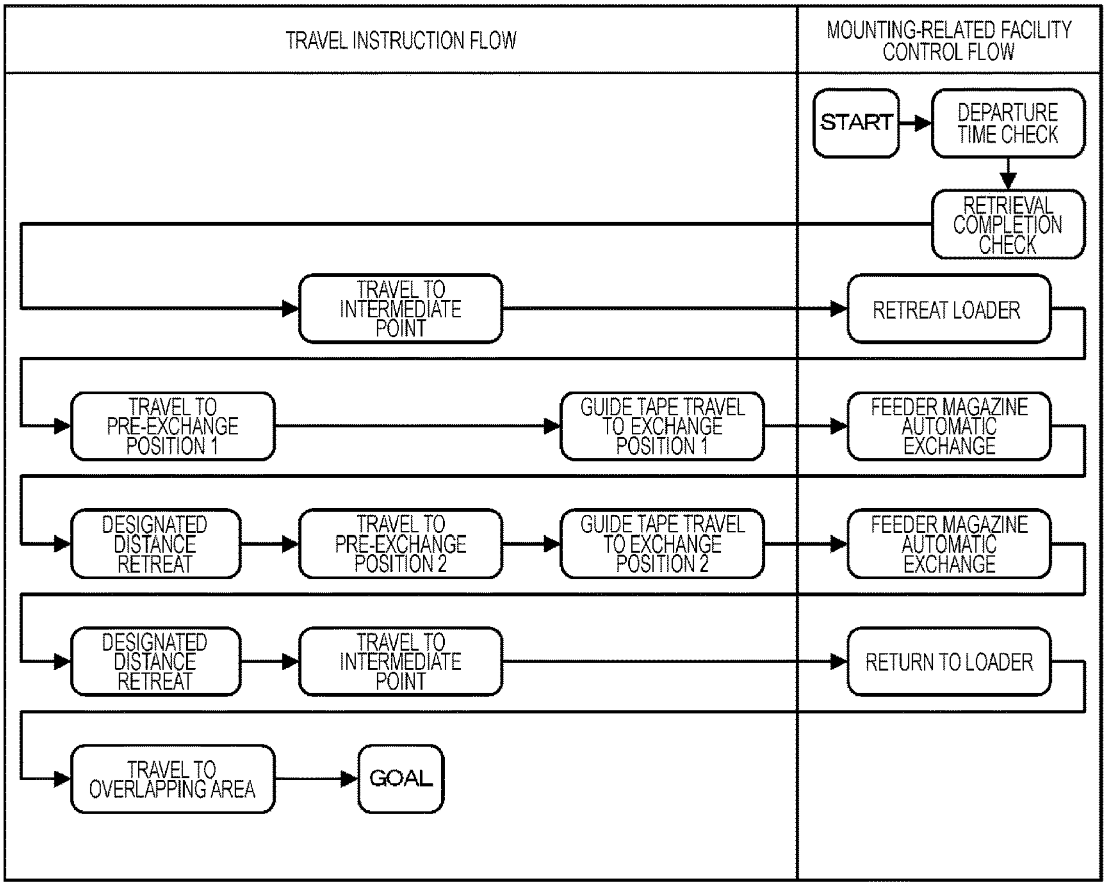
FIG. 13 is an explanatory diagram illustrating an example of the flow setting content.
Figure 14:
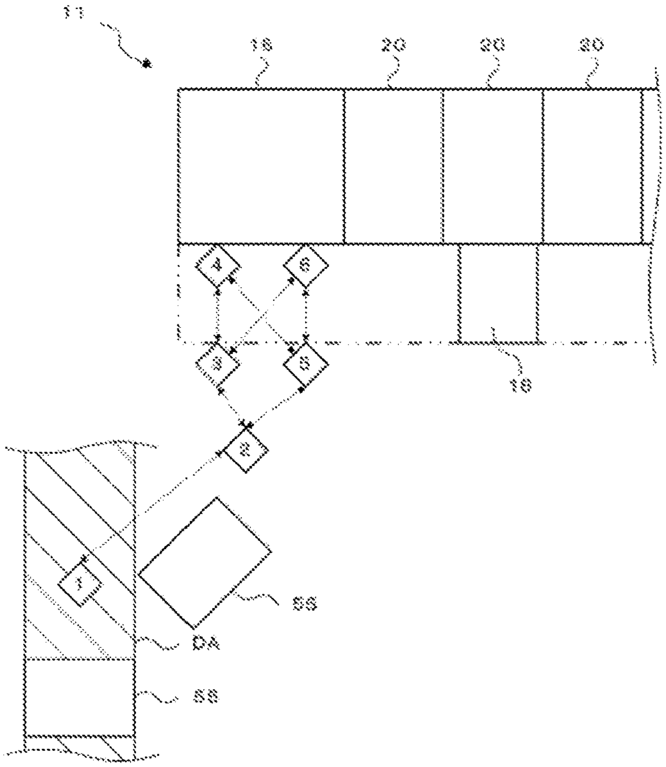
FIG. 14 is an explanatory diagram illustrating an example of a travel position of AGV 55.

FIG. 13 illustrates an example in which a travel instruction flow and a mounting-related facility control flow are set based on an instruction block of company E. FIG. 14 is an explanatory diagram illustrating an example of a travel position of AGV 55 and illustrates an example of the travel position in the positions 1 to 6. In the example of FIG. 13, first CPU 41 performs "departure time check" for checking the time of departure of AGV 55 based on a travel plan of AGV 55. When checking that the time of departure elapses, CPU 41 performs "retrieval completion check" for checking that retrieval of feeder 24 to storage chamber 16 is completed. Here, CPU 41 checks whether the retrieval of feeder 24 which is unnecessary by each mounter 20 of mounting line 11 and is returned to conveyance-side control area A2 (setup area) is completed. Further, when first AGV 55 arrives at storage chamber 16 in a state in which retrieval of feeder 24 is not completed on storage chamber 16 side, AGV 55 continuously stands by in front of storage chamber 16 until the retrieval (preparation) of feeder 24 is completed, and thereby, interference with the work of loader 18 occurs. The "retrieval completion check" is performed to prevent the interference.

When the retrieval completion check is made, CPU 41 instructs AGV 55 standing by in, for example, overlapping area DA (the position 1 in FIG. 14) to "travel to an intermediate point (the position 2 in FIG. 14)", and thereby, "retreat" of loader 18 is made. The reason why loader 18 is retreated is to prevent interference because, in a case where AGV 55 moves to the periphery of storage chamber 16 in order to replenish and retrieve feeder 24, when loader 18 is located in the periphery of storage chamber 16, both interfere with each other. Subsequently, CPU 41 instructs AGV 55 to perform the "travel to pre-exchange position 1 (a position 3 in FIG. 14)" from the intermediate point, and furthermore instructs to perform the "guide tape travel to exchange position 1 (a position 4 in FIG. 14)" from the pre-exchange position 1.

When AGV 55 moves to the exchange position 1, CPU 41 causes feeder 24 to perform the "automatic exchange". Further, when the "automatic exchange" at the exchange position 1 is completed, CPU 41 instructs AGV 55 to perform the "designated distance retreat", and further instructs to perform the "travel to pre-exchange position 2 (a position 5 in FIG. 14)". Then, CPU 41 instructs AGV 55 to perform the "guide tape travel to exchange position 2 (a position 6 in FIG. 14)" from the pre-exchange position 2. When AGV 55 moves to the exchange position 2, CPU 41 causes feeder 24 to perform the "automatic exchange". Here, for example, multiple feeders 24 are mounted in a magazine, automatic exchange per magazine is made at once between AGV 55 and storage chamber 16. Accordingly, for example, among the exchange position 1 and the exchange position 2, the automatic exchange is controlled such that a magazine in which feeder 24 of a supply target is mounted on one side is passed from AGV 55 to storage chamber 16, and a magazine in which feeder 24 of a retrieval target is mounted is received from storage chamber 16 by AGV 55. The exchange position 1 and the exchange position 2 are interchanged alternately and subsequently. Further, as long as AGV 55 and storage chamber 16 have a configuration in which feeders 24 can be individually transferred, the processing is not limited to automatically exchanging of the magazines at once, and the automatic exchange may be performed by transferring feeder 24 individually.

When the "automatic exchange" of feeder 24 in the exchange position 2 is completed in this manner, CPU 41 instructs the AGV 55 to perform the "designated distance retreat" and furthermore instructs to perform the "travel to intermediate point (the position 2 in FIG. 14)". Next, CPU 41 performs "return" of retreated loader 18 in order to allow the work of loader 18 in storage chamber 16. Then, CPU 41 instructs AGV 55 to perform the "travel to overlapping area DA (the position 1 in FIG. 14)", and ends the processing. In this way, AGV 55 can be caused to perform an automatic exchange work of feeder 24 in storage chamber 16 while appropriately avoiding an interference with loader 18. The flow of FIG. 13 and each position of FIG. 14 are merely examples, and AGV 55 may move directly from an intermediate point to an exchange position (a position 4 and a position 6 in FIG. 14) without setting, for example, a pre-exchange position (a position 3 and a position 5 in FIG. 14). Further, in order to reduce a movement time, a standby point may be set between overlapping area DA (the position 1 in FIG. 14) and an intermediate point (the position 2 in FIG. 14), and CPU 41 may cause AGV 55 to move and stand by at the standby point before a retrieval completion check and may cause AGV 55 to quickly move to the intermediate point after the retrieval completion check.

Here, a correspondence between elements of the present embodiment and elements of the present disclosure will be clarified. Mounting-related system 10 of the present embodiment corresponds to a mounting-related system of the present disclosure, AGV 55 corresponds to an automatic conveyance vehicle, HDD 44 of mounting control device 40 corresponds to a storage section, CPU 41 and output device 46 that perform S200 of travel instruction flow setting processing correspond to a display section, CPU 41 that performs S230 of the travel instruction flow setting processing corresponds to a setting section, and CPU 41 corresponds to a control section. CPU 41 that performs instruction block registration processing corresponds to a registration section.

In mounting-related system 10 described above, instruction blocks 44*a* of multiple types of AGVs 55 are displayed on setting screen 47 so as to be selectable by worker M, travel instruction flow 44*b* of AGV 55 is set based on selected instruction block 44*a*, and a travel control of AGV 55 is performed. Accordingly, it is possible to easily set travel instruction flow 44*b* according to the type of AGV 55. Further, since it is not necessary to construct travel instruction flow 44*b* every time a travel control is performed, the travel control of AGV 55 can be easily made.

Further, block display field 47*a* and travel instruction flow display field 47*b* are displayed on setting screen 47, and instruction block 44*a* selected from block display field 47*a* can be arranged in travel instruction flow display field 47*b* to set a travel instruction flow by a drag-and-drop operation of worker M. Accordingly, worker M can easily set the travel instruction flow with a simple operation.

Further, instruction block 44*a* which can be randomly selected by worker M or the like as to whether an instruction content for the same type of AGV 55 is to be included in travel instruction flow 44*b* is stored in HDD 44. Accordingly, worker M or the like can easily set a travel instruction flow suitable for mounting-related system 10.

Further, since the type of AGV 55 and the instruction content can be received and instruction block 44*a* can be registered in HDD 44 in association with the type of AGV 55, a travel instruction flow corresponding to the type of AGV 55 can be easily set even when the type of available AGV 55 is increased.

It is needless to say that the present disclosure is not limited to the embodiments described above, but may be practiced in various forms within the technical scope of the present disclosure.

For example, in the above embodiment, mounting control device 40 receives the type and an instruction content of AGV 55 from manufacturer terminal 70; however, the configuration is not limited to this. For example, a management device or the like of work system 1 may receive the type and the instruction content of AGV 55 from manufacturer terminal 70 via network 80 and may transmit the type and instruction content of AGV 55 to mounting control device 40. Further, the type and the instruction content of AGV 55 are not limited to being received via network 80 and may be received via a portable storage medium or the like. Alternatively, the additional reception or registration is not essential and may be omitted.

In the above-described embodiments, "buzzer notification" and the like other than a travel method is exemplified as instruction block 44*a* in which worker M or the like can randomly select whether to be included in a travel instruction flow; however, the configuration is not limited to this. For example, as long as AGV 55 can be randomly selected from multiple types of travel methods, instruction block 44*a* of the travel method may be randomly selected. Alternatively, instruction block 44*a* capable of randomly selecting whether to be included in the travel instruction flow need not be included.

In the above-described embodiments, a drag-and-drop operation of an instruction block can be performed by displaying, on the setting screen 47, block display field 47*a*, travel instruction flow display field 47*b*, and mounting-related facility control flow display field 47*c*; however, the configuration is not limited to this. For example, the travel instruction flow may be set according to a selection sequence only by selectively operating an instruction block of setting screen 47 by a click operation or the like. That is, in setting screen 47, instruction blocks 44*a* of multiple types of AGVs 55 may be displayed so as to be selectable by an operator, and a travel instruction flow may be set based on selected instruction block 44*a*. Further, travel instruction flow display field 47*b* and mounting-related facility control flow display field 47*c* are not limited to being set on same setting screen 47 and may be respectively set on different setting screens.

In the above embodiments, mounting control device 40 controls AGV 55 such that an area around each mounting line 11 is set as mounting-side control area A1; however, the configuration is not limited to this. For example, an area around a mounting-related facility controlled by mounting control device 40 may be set as a mounting-side control area even in an area other than the periphery of mounting line 11. Alternatively, an area required to move loader 18 and an area required to prevent contact with loader 18 even when AGV 55 slightly meanders while traveling along a movement direction of loader 18 may be set as mounting-side control area A1. Further, a control area of AGV 55 is not limited to being divided, and mounting control device 40 may perform a travel control of AGV 55 in all areas including conveyance-side control area A2. Further, in the embodiments, mounting-related system 10 includes loader 18, however, the configuration is not limited to this, and loader 18 need not be provided. Even when mounting-related system 10 does not include loader 18, it is necessary to prevent interference with an operation portion such as opening and closing portions of an operation device other than loader 18 or a mounting-related facility. Further, AGV 55 is not limited to working in a work area other (storage chamber 16) common with loader 18 and may work at an area other than a common work area even when loader 18 exists.

Here, the mounting-related system of the present disclosure may be configured as follows. For example, in the mounting-related system of the present disclosure, the display section may display, on the same screen, a block display field for displaying the instruction blocks to be classified for each type of the automatic conveyance vehicle, and a flow display field capable of displaying the travel instruction flow by arranging the instruction blocks selected from the block display field by a drag-and-drop operation performed by the operator, and the setting unit may set the travel instruction flow based on display content of the flow display field. By doing so, an operator can easily set a travel instruction flow with a simple operation.

In the mounting-related system of the present disclosure, the storage section may store the instruction block that is the instruction content for the automatic conveyance vehicle of the same type and is capable of being randomly selected by the operator as to whether to be included in the travel instruction flow. By doing so, even in the same type of automatic conveyance vehicle, an operator can set a travel instruction flow suitable for a mounting-related system while selecting an instruction block as needed.

The mounting-related system of the present disclosure may further include a registration section configured to receive a type of the automatic conveyance vehicle and the instruction content and register the instruction block of the received instruction content in the storage section in association with the type of the automatic conveyance vehicle. By doing so, even when the types of automatic conveyance vehicles capable of being used in a mounting-related systems increase, a travel instruction flow matching the type of automatic conveyance vehicle can be easily set.

INDUSTRIAL APPLICABILITY

The present disclosure can be used in a mounting-related system or the like for controlling an automatic conveyance vehicle.

REFERENCE SIGNS LIST

1 work system, 10 mounting-related system, 11 mounting line, 12 print device, 14 print inspection device, 16 storage chamber, 18 loader, 20 mounter, 22 mounting unit, 24 feeder, 28 mounting inspection device, 30 reflow device, 32 reflow inspection device, 40 mounting control device, 41 CPU, 42 ROM, 43 RAM, 44 HDD, 44*a* instruction block,

44*b* travel instruction flow, input device, 46 output device, 47 setting screen, 47*a* block display field, 47*b* travel instruction flow display field, 47*c* mounting-related facility control flow display field, 47*d* instruction pointer, conveyance system, 55 automatic conveyance vehicle (AGV), 57 charging station, 58 conveyance control device, 60 warehouse, 70 manufacturer terminal, 72 input device, 74 output device, 80 network, A1 mounting-side control area, A2 conveyance-side control area, DA overlapping area, M worker, S board

The invention claimed is:

1. A component mounting-related system which includes a mounting-related facility for performing a mounting process and in which a member used in the mounting process is automatically conveyed to the mounting-related facility by an automatic conveyance vehicle, the mounting-related system comprising:

a storage section configured to store instruction content for performing an instruction for travel of the automatic conveyance vehicle, for each of multiple types of the automatic conveyance vehicle as an instruction block capable of being block-displayed on a screen;

a display section configured to display the instruction blocks of the multiple types of the automatic conveyance vehicle on the screen to be selectable by an operator:

a setting section configured to set a travel instruction flow of the automatic conveyance vehicle configured to perform the automatic conveyance in the mounting-related system, based on the instruction block selected by the operator from among the instruction blocks displayed on the screen; and a control section configured to perform a travel control of the automatic conveyance vehicle based on the set travel instruction flow, wherein the display section displays, on the same screen, a block display field for displaying the instruction blocks to be classified for each type of the automatic conveyance vehicle, and a flow display field capable of displaying the travel instruction flow by arranging the instruction blocks selected from the block display field by a drag-and-drop operation performed by the operator, and the setting unit sets the travel instruction flow based on display content of the flow display field.

2. A component mounting-related system which includes a mounting-related facility for performing a mounting process and in which a member used in the mounting process is automatically conveyed to the mounting-related facility by an automatic conveyance vehicle, the mounting-related system comprising:

a storage section configured to store instruction content for performing an instruction for travel of the automatic conveyance vehicle, for each of multiple types of the automatic conveyance vehicle as an instruction block capable of being block-displayed on a screen;

a display section configured to display the instruction blocks of the multiple types of the automatic conveyance vehicle on the screen to be selectable by an operator;

a setting section configured to set a travel instruction flow of the automatic conveyance vehicle configured to perform the automatic conveyance in the mounting-related system, based on the instruction block selected by the operator from among the instruction blocks displayed on the screen; and a control section configured to perform a travel control of the automatic conveyance vehicle based on the set travel instruction flow, wherein the storage section stores the instruction block that is the instruction content for the automatic conveyance vehicle of the same type and is capable of being randomly selected by the operator as to whether to be included in the travel instruction flow.

3. The component mounting-related system according to claim 1, further comprising:

a registration section configured to receive a type of the automatic conveyance vehicle and the instruction content and register the instruction block of the received instruction content in the storage section in association with the type of the automatic conveyance vehicle.

4. The component mounting-related system according to claim 2, further comprising:

a registration section configured to receive a type of the automatic conveyance vehicle and the instruction content and register the instruction block of the received instruction content in the storage section in association with the type of the automatic conveyance vehicle.

* * * * *